US010862489B2

(12) United States Patent
van den Heuvel et al.

(10) Patent No.: US 10,862,489 B2
(45) Date of Patent: Dec. 8, 2020

(54) SIGNAL GENERATOR (71) Applicant: Stichting IMEC Nederland, Eindhoven (NL)

(72) Inventors: Johan van den Heuvel, Geldrop (NL); Paul Mateman, Millingen a/d Rijn (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 16/670,394

(22) Filed: Oct. 31, 2019

(65) Prior Publication Data

US 2020/0136628 A1    Apr. 30, 2020

(30) Foreign Application Priority Data

Oct. 31, 2018 (EP) .................................. 18203686

(51) Int. Cl.
*H03L 7/099* (2006.01)
*H03L 7/093* (2006.01)
(Continued)

(52) U.S. Cl.
CPC ......... *H03L 7/0991* (2013.01); *H03B 5/1265* (2013.01); *H03C 3/0991* (2013.01);
(Continued)

(58) Field of Classification Search
CPC ... H03L 7/099; H03L 2207/50; H03L 7/0991; H03L 7/093; H03L 1/00; H03B 2200/005; H03B 5/1265
See application file for complete search history.

(56) References Cited

U.S. PATENT DOCUMENTS 8,994,467 B2 * 3/2015 Lee .................... H03L 7/095
                                                  331/117 FE
9,608,641 B2    3/2017 Van Den Heuvel
(Continued)

FOREIGN PATENT DOCUMENTS

EP    2988421 A1    2/2016
EP    3190704 A1    7/2017
WO    2013/070218 A1    5/2013

OTHER PUBLICATIONS

European Search Report, European Patent Application No. 18203686.3, dated May 6, 2019, 10 pages.
(Continued)

*Primary Examiner* — Ryan A Johnson
(74) *Attorney, Agent, or Firm* — McDowell Boehnen Hulbert & Berghoff LLP (57) ABSTRACT

A signal generator comprises (i) a first set of capacitors at least partially switchably connectable for adjusting a frequency of an oscillator as part of a phase-locked loop and (ii) a second set of capacitors comprised in one or more oscillator control subsystems. A method of controlling the signal generator comprises: (i) acquiring a frequency lock in the phase-locked loop, (ii) calculating, in conjunction with the acquiring of the frequency lock, a systematic capacitance error of the first set of capacitors due to process, voltage, and temperature variations based on the frequency of the oscillator and a switching state of the first set of capacitors, and (iii) calibrating the one or more oscillator control subsystems using the systematic capacitance error, thereby compensating for process, voltage, and temperature variations common between the first set of capacitors and the second set of capacitors.

20 Claims, 6 Drawing Sheets

(51) Int. Cl.
*H03B 5/12* (2006.01)
*H03C 3/09* (2006.01)
*H03L 1/00* (2006.01)

(52) U.S. Cl.
CPC ................ *H03L 1/00* (2013.01); *H03L 7/093* (2013.01); *H03L 7/099* (2013.01); *H03B 2200/005* (2013.01); *H03L 2207/50* (2013.01)

(56) References Cited

U.S. PATENT DOCUMENTS

| | | |
|---|---|---|
| 2013/0265114 A1 | 10/2013 | Lee et al. |
| 2015/0207514 A1 | 7/2015 | Kim et al. |
| 2015/0229316 A1 | 8/2015 | Walker et al. |

OTHER PUBLICATIONS

Liao, Dongyi et al., "An 802.11 a/b/g/n Digital Fractional-N PLL With Automatic TDC Linearity Calibration for Spur Cancellation", IEEE Journal of Solid-State Circuits, vol. 52, No. 5, May 2017, pp. 1210-1220.

Staszewski, Robert Bogdan, "State-of-the-Art and Future Directions of High-Performance All-Digital Frequency Synthesis in Nanometer CMOS", IEEE Transactions on Circuits and Systems-I: Regular Papers, vol. 58, No. 7, Jul. 2011, pp. 1497-1510.

\* cited by examiner

SIGNAL GENERATOR

CROSS-REFERENCE TO RELATED APPLICATION

The present application is a non-provisional patent application claiming priority to European Patent Application No. 18203686.3 filed Oct. 31, 2018, the contents of which are hereby incorporated by reference.

TECHNICAL FIELD

The present disclosure relates to a method of controlling a signal generator, to a signal generator, and to an RF transmitter comprising a signal generator.

BACKGROUND

Signal generators comprising phase-locked loops may comprise a digitally-controlled oscillator (DCO) controlled by an all-digital phase-locked loop (ADPLL). Such signal generators may, for example, be used in polar transmitters, both narrow-band, such as Bluetooth Low Energy (BLE) and IEEE 802.11ah, and wide-band polar such as IEEE 802.11b/g/n.

Due to process, voltage, and temperature (PVT) variations affecting the signal generator circuit, capacitor values of capacitors comprised in the signal generator will differ from their nominal ones. As an example, over process corners, a typical capacitance variation in 40 nm and 28 nm silicon is approximately +/−25%. This leads to long calibration times, and to large settling times of the phase-locked loop in worst-case process corners.

Accordingly, there exists a need to improve the settling characteristics of the phase-locked loop of such a signal generator.

SUMMARY to the present disclosure provides a signal generator having a phase-locked loop with improved settling characteristics. These and other aspects of the present disclosure are at least partly defined in the independent claims. Additional example embodiments are set out in the dependent claims.

According to a first aspect of the present disclosure, there is provided a method of controlling a signal generator, the signal generator comprising a first set of capacitors at least partially switchably connectable for adjusting a frequency of an oscillator as part of a phase-locked loop (PLL); and a second set of capacitors comprised in one or more oscillator control subsystems, the method comprising acquiring a frequency lock (ACQ), in the phase-locked loop; calculating, in conjunction with the acquiring of the frequency lock, a systematic capacitance error of the first set of capacitors due to process, voltage, and temperature (PVT) variations, based on the frequency of the oscillator and a switching state of the first set of capacitors; and calibrating the one or more oscillator control subsystems using the systematic capacitance error, thereby compensating for process, voltage, and temperature variations common between the first set of capacitors and the second set of capacitors.

With "switching state" should be understood any information describing the state of connected and/or disconnected capacitors in the first set of capacitors, such as, e.g., the total capacitance connected or the number of connected capacitors.

The phase-locked loop can settle in a sequence of more than one locking step, with increasingly fine-grained frequency control. With "frequency lock" should be understood any stage of locking of the phase-locked loop, for example, but not limited to, one based on cycle counting.

The one or more oscillator control subsystems control the oscillator and comprise capacitors that require calibration. These capacitors form the second set of capacitors. These oscillator control subsystems may, for example, directly control the capacitance of the oscillator, and thereby the oscillator frequency, in addition to the capacitors of the first set of capacitors, with the first set of capacitors and the second set of capacitors being separate. Alternatively, the second set of capacitors may be a subset of the first set of capacitors, for example, used in a later locking step of the phase-locked loop than the frequency lock. Alternatively, or additionally, one or more of the oscillator control subsystems may control the oscillator in other indirect ways. Example uses in this case are the conversion of digital signals into specific analog values for use in the signal generator, such as a time or a capacitance.

The relative capacitance error due to PVT variations can be very similar between different capacitors and sets of capacitors in the circuitry of the signal generator, thus being a systematic error, since all circuitry components can be made from the same silicon die.

The oscillator frequency has an intrinsic dependence on the capacitance of the oscillator circuit. In the case of an LC oscillator, the oscillator frequency is proportional to one divided by the square root of the product of the capacitance and the inductance of the circuit. With the acquisition of the frequency lock in the phase-locked loop, the actual capacitance of the circuit may therefore be calculated based on the locked-on frequency and this intrinsic dependence, provided that other parameters, such as the inductance, are known with reasonable accuracy. The switching state of the first set of capacitors provide knowledge of the nominal capacitance of the oscillator. In combination, this allows an estimation of the systematic relative capacitance error due to PVT variations. In some cases, the inductance is known to within 2% accuracy, which determines the achievable accuracy of the systematic capacitance error calculation.

Using the calculated systematic capacitor error, as a starting point, for instance, in the calibration of the capacitors of one or more of these oscillator control subsystems, shortens the calibration time and helps with convergence of calibration algorithms, leading to a shorter time until settling of the phase-locked loop.

According to an embodiment, the calculating comprises calculating an actual capacitance of the first set of capacitors based on the oscillator frequency and, in some examples, an inductance of an inductor of the oscillator; calculating a nominal capacitance of the first set of capacitors based on the switching state of the first set of capacitors; and calculating the systematic capacitance error based on the actual capacitance and the nominal capacitance. Calculating the actual capacitance and the nominal capacitance, and then the systematic capacitance error based on these two capacitances, allows for a straightforward calculation that is easy to implement.

According to an embodiment, a subsystem among the one or more subsystems is a modulation (MOD) stage of the oscillator. The purpose of the MOD stage is to modify the capacitance of the oscillator for frequency modulating the generated signal. In some examples, the MOD stage is not part of the phase-locked loop and the capacitors of the MOD stage are separate from the first set of capacitors. Since the same inductor is used for the MOD stage as for the first set of capacitors, any error related to the inductance cancels out, leading to an effective accuracy of the calculated systematic capacitance error better than 1%. In broad-band modulation, for the phase-locked loop not to be pushed out of lock during performance of frequency modulation, the MOD stage can be well calibrated, with the proper MOD gain known before transmission. At the same time, in some cases, calibration can only by performed by frequency modulating the signal. Using the calculated systematic capacitor error for calibrating the MOD capacitors breaks or at least mitigates this impasse, as the MOD calibration spread can be dominated by the capacitor error, simplifying and speeding up the procedure of getting the signal generator ready for performing frequency modulation.

According to an embodiment, the signal generator further comprises a phase-detection stage for the phase-locked loop, such as a time-to-digital converter (TDC). This stage serves to compare the phase of the signal generated by the oscillator to a reference phase, as part of the phase-locked loop, and can be used in a phase-lock step which can occur after the frequency lock.

According to an embodiment, a subsystem among the one or more subsystems is a digital-to-time converter +(DTC) configured to produce a phase reference input to the phase-detection stage. The DTC comprises capacitors that need calibration. The time for calibrating the DTC can be long compared to the settling time of the phase-locked loop. Using the calculated systematic capacitor error for calibrating the DTC stage allows for a considerable shortening of the time for calibrating the DTC, as the calibration spread of the DTC can be dominated by the capacitor error due to PVT variations. This in turns leads to a considerable shortening of the total time until settling of the phase-locked loop.

According to an embodiment, a subsystem among the one or more subsystems is a phase-lock loop filter controlling a capacitor bank, TRK, the capacitor bank being at least partially switchably connectable for adjusting the frequency of the oscillator as part of the phase-locked loop, the capacitor bank being comprised in the second set of capacitors. The capacitor bank can be used in a phase-detection step of the phase-locked loop, the phase-detection step occurring after the frequency lock. In this case, the second set of capacitors may be a subset of the first set of capacitors. This shortens the time to achieve a phase-lock in the phase-locking step of the phase-locked loop, as less adjustment of the number of connected capacitors in the TRK bank will be needed during the phase-detection step.

According to an embodiment, the acquiring of the frequency lock occurs in a cycle-counting phase of the phase-locked loop. "Cycle-counting" should be understood as any phase of the phase-locked loop based on counting or measuring integer numbers of cycles of the oscillator output signal, using, for example, a counter or a divider. A lock based on cycle-counting can be the first time that a frequency lock is achieved in the phase-locked loop. This therefore allows for the calculation of the systematic capacitance error early on, maximizing its use thereafter.

According to an embodiment, the calibrating of the one or more oscillator control subsystems occurs after, or only after, the acquiring of the frequency lock. This allows the calibration to start with a correctly calculated systematic capacitance error.

According to an embodiment, the calibrating of the one or more oscillator control subsystems occurs during the acquiring of the frequency lock. Starting calibration of the one or more oscillator control subsystem during acquiring of the frequency lock, i.e., before a frequency lock has been achieved in the phase-locked loop, means that a longer time for calibration is available, although the calibration will start with a preliminary value for the systematic capacitance variation, that may be updated at one or more points in time or continuously until frequency lock has been acquired in the phase-locked loop.

According to an embodiment, the calibrating of the one or more oscillator control subsystems occurs before and/or during acquiring of a phase lock, TRK, in a phase-detection step of the phase-locked loop.

According to an embodiment, the second set of capacitors are not part of the phase-locked loop.

According to an embodiment, the oscillator is a digitally controlled oscillator (DCO).

According to an embodiment, the phase-locked loop is an all-digital phase-locked loop (ADPLL).

According to a second aspect, there is provided a signal generator comprising: a first set of capacitors at least partially switchably connectable for adjusting a frequency of an oscillator as part of a phase-locked loop (PLL); and a second set of capacitors comprised in one or more oscillator control subsystems; and a processor or circuitry configured to calculate, in conjunction with acquiring of a frequency lock in the phase-locked loop, a systematic capacitance error of the first set of capacitors due to process, voltage, and temperature (PVT) variations, based on the frequency of the oscillator and a switch state of the first set of capacitors; and calibrate the one or more oscillator control subsystems using the systematic capacitance error, thereby compensating for process, voltage, and temperature variations common between the first set of capacitors and the second set of capacitors. This second aspect may generally present the same or corresponding advantages as the first aspect.

According to a third aspect, there is provided a wireless transceiver comprising the signal generator of the second aspect. This third aspect may generally present the same or corresponding advantages as the first aspect.

BRIEF DESCRIPTION OF THE DRAWINGS

The above, as well as additional features of the present disclosure, will be better understood through the following illustrative and non-limiting detailed description, with reference to the appended drawings. In the drawings like reference numerals will be used for like elements unless stated otherwise.

DETAILED DESCRIPTION

Figure 1:
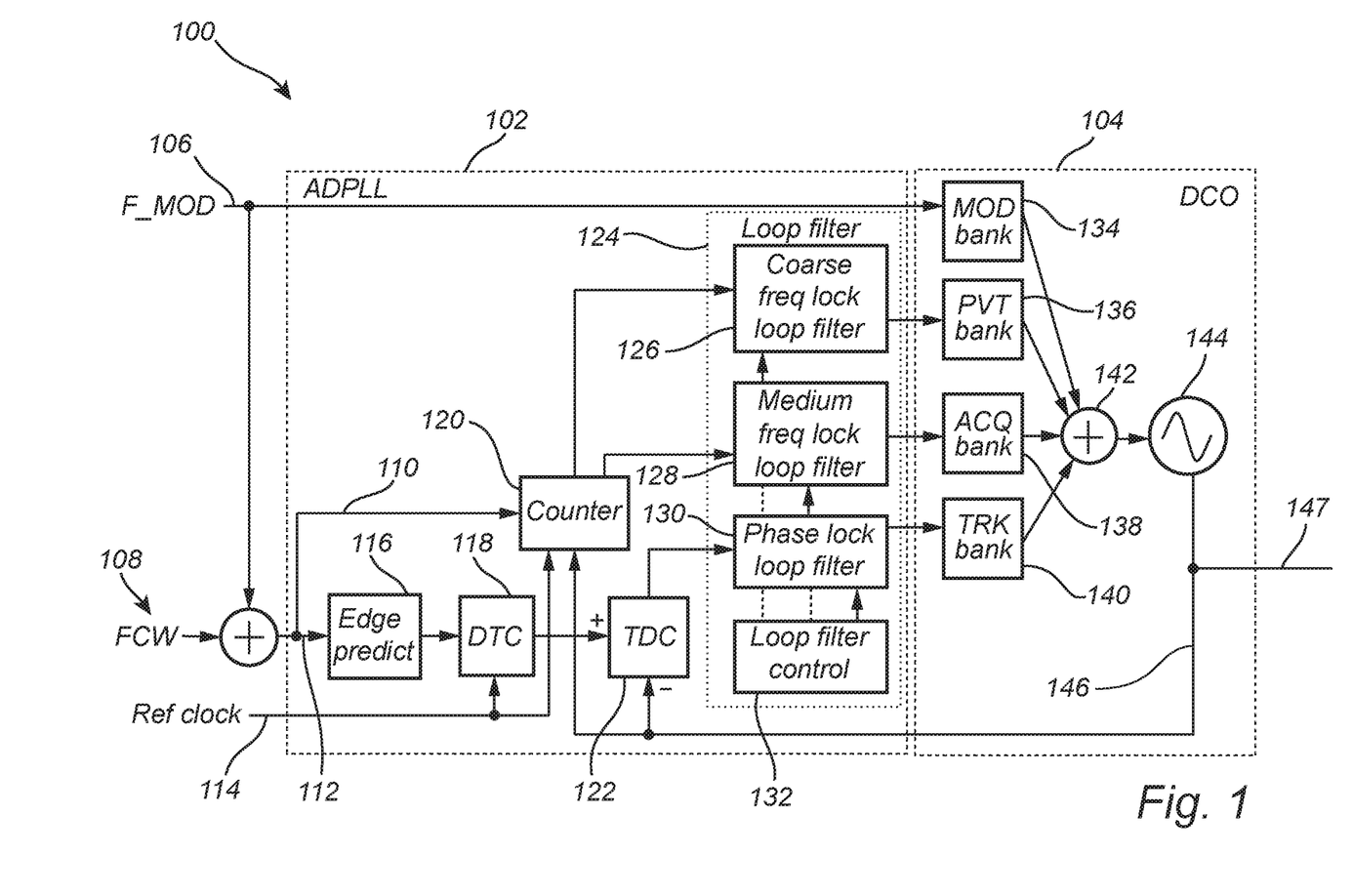
FIG. 1 is a block diagram of a signal generator comprising an all-digital phase-locked loop and a digitally-controlled oscillator, in accordance with an example embodiment.

FIG. 1 shows a block diagram of a signal generator 100. The signal generator 100 comprises an all-digital phase-locked loop (ADPLL) control block 102 and a digitally-controlled oscillator (DCO) block 104. The signal generator 100 may form part of a wireless transmitter or a wireless transceiver (not shown).

The DCO block 104 comprises a number of banks of switchably connectable capacitors whose capacitances are added 142 together for digitally controlling the frequency of the oscillator 144. The banks comprise a "PVT" bank 136 for coarse frequency control, an "ACQ" bank 138 for medium frequency control, and a "TRK" bank 140 for fine frequency control. Additionally, one or more of the banks may comprise a fixed capacitance.

The ADPLL control block 102 controls the DCO block 104 and its associated phase-locked loop 146, where the generated signal 147 is looped back into the ADPLL control block 102. A loop filter 124 controls the "PVT" 136, "ACQ" 138, and "TRK" 140 capacitor banks of the DCO block 104. In particular, each of the "PVT" 136, "ACQ" 138, and "TRK" 140 capacitor banks are controlled, respectively, by a coarse frequency lock loop filter 126, a medium frequency lock loop filter 128, and a phase-lock loop filter 130. The coarse frequency lock loop filter 126, the medium frequency lock loop filter 128, and the phase-lock loop filter 130 are controlled by a loop filter control block 132. Thus, the "PVT" 136, "ACQ" 138, and "TRK" 140 banks form a first set of capacitors at least partially switchably connectable for adjusting the frequency of the oscillator 144 as part of the phase-locked loop 146.

Additionally, an optional "MOD" capacitor bank 134 may be used for frequency modulating the oscillator output signal 147. The capacitors of the "MOD" bank 134 directly control the capacitance of the oscillator 144, but they do not form part of the phase-locked loop 146. They are separate from the capacitors of the "PVT" 136, "ACQ" 138, and "TRK" 140 banks, i.e., the first set of capacitors.

A frequency control word (FCW) 108 may be input to the ADPLL control block 102 for setting the oscillator frequency, possibly modified by a frequency modulation word (F_MOD) 106. The frequency modulation word 106 also controls the capacitors of the "MOD" bank 134. The frequency control word 108, possibly modified by the frequency modulation word 106, comprises an integer part 110 and a fractional part 112. The integer part is input to a counter 120, which counts the number of cycles of the looped-back generated signal 146 in respect to a reference clock 114. The result relative to the integer part 110 of the frequency control word is fed to the loop filter 124, in particular to the coarse frequency lock loop filter 126 and the medium frequency lock loop filter 128, completing the phase-locked loop 146.

The fractional part 112 of the frequency control word is input to an edge prediction block 116, which calculates a phase advance that the generated signal should have relative to the reference clock 114. This calculated phase advance is converted by a digital-to-time converter (DTC) 118 to a phase reference signal, which is fed into a phase detection stage 122, here in the form of a time-to-digital converter (TDC) 122, which compares the phase of the reference signal with that of the generated signal 126. The result of this comparison is fed into the loop filter 124, in particular the phase-locked loop filter 130, completing the phase-locked loop 146.

Figure 3:
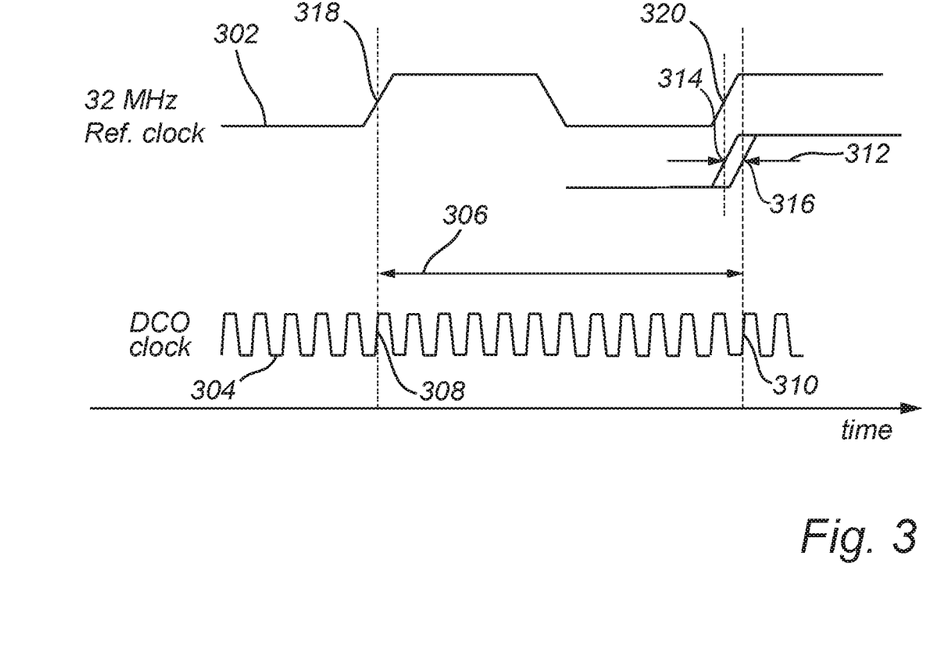
FIG. 3 is a timing diagram that illustrates the principles of cycle counting and phase detection in an all-digital phase-locked loop, in accordance with an example embodiment.

FIG. 3 illustrates the principles of frequency lock and phase lock in the all-digital phase-locked loop, showing a 32 MHz reference signal 302, 114 and the signal from the oscillator 304, 146. The counter 120 counts the number 306 of cycles between two leading edges 318 and 320 of the reference clock signal 302, 114. The DTC 118 provides a programmable delay 312 for lining up a leading edge 314 of the reference clock signal 302, 114 to the time 316 which matches the leading edge 310 of the DCO clock 304, thus converting a digital code for a specific delay to a timing. This allows the phase detection stage 122 to compare the leading edge 316 of the thus delayed reference clock signal 302, 114. The counting and frequency lock precedes phase detection and phase lock, as will be explained in the following.

The calculation of the systematic relative capacitance error due to PVT variations may be performed as follows. If the oscillator 144 is an LC oscillator, due to the intrinsic dependence of the frequency of the oscillator 144 on the total capacitance and the total inductance of the oscillator 144, the total capacitance $C_{total,actual}$ can be calculated as:

$$C_{total,actual} = \frac{1}{(2\pi f_{lock})^2 L} \quad (1)$$

wherein $f_{lock}$ is the oscillator frequency in conjunction with the acquiring of a frequency lock, for example as given by the frequency control word, and L is the total inductance of the oscillator. The calculation is thus based on the oscillator frequency.

The nominal expected capacitance $C_{total,nominal}$ may be calculated as:

$$C_{total,nominal} = C_{fixed} + N_{PVT}C_{PVT,nominal} + N_{ACQ}C_{ACQ,nominal} + N_{TRK}C_{TRK,nominal} \quad (2)$$

wherein $C_{fixed}$ is the nominal fixed capacitance of the oscillator, $C_{PVT,nominal}$ is the nominal capacitance of each of the connectable capacitors of the "PVT" bank 136, $C_{ACQ,nominal}$ is the nominal capacitance of each of the connectable capacitors of the "ACQ" bank, $C_{TRK,nominal}$ is the nominal capacitance of each of the connectable capacitors of the "TRK" bank 140, $N_{PVT}$ is the number of connected capacitors in the "PVT" bank, $N_{ACQ}$ is the number of connected capacitors in the "ACQ" bank 138, and $N_{PVT}$ is the number of connected capacitors in the "PVT" bank 136. The calculation is thus based on a switching state of the first set of capacitors, which in this case is the number of capacitors connected in each of the banks.

Finally, the relative systematic capacitance error can be calculated as:

$$R = \frac{C_{total,actual}}{C_{total,nominal}} \quad (3)$$

For convenience, $C_{total,actual}$ and $C_{total,nominal}$ may be expressed as dimensionless numbers, for example in units of $C_{PVT,nominal}$. The calculation may be performed in digital circuitry as will be described below in conjunction with FIG. 2. Alternatively, the calculation can be performed using a microprocessor, microcontroller, or similar device.

Figure 2:
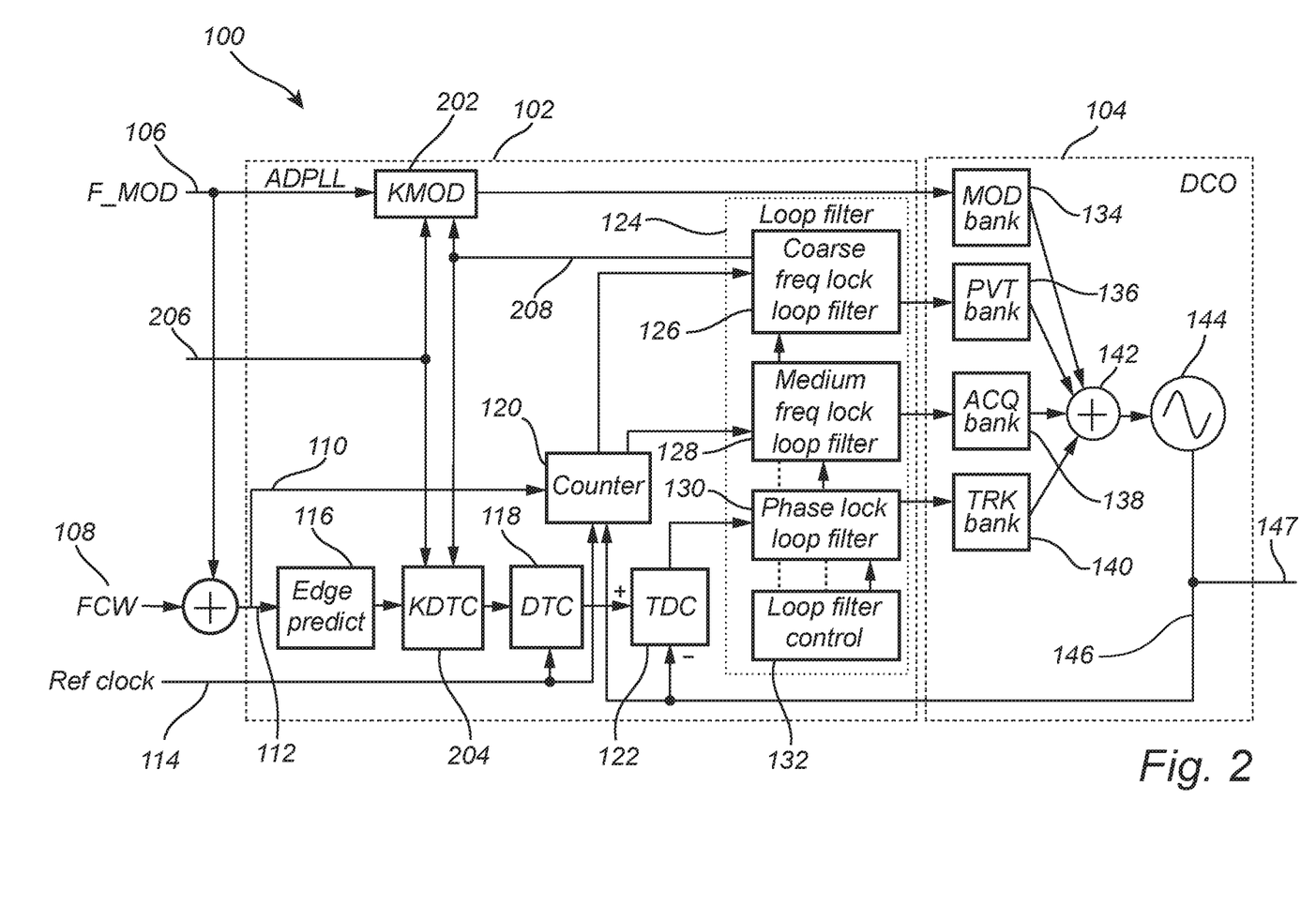
FIG. 2 is a block diagram of a signal generator comprising an all-digital phase-locked loop and a digitally-controlled oscillator, showing, at block level, circuitry for carrying out the calculation of the systematic capacitance error and calibrating oscillator control subsystems, in accordance with an example embodiment.

FIG. 2 shows the signal generator of FIG. 1 with circuitry for performing the calculation of the systematic capacitance error, for example as described above. All other features are as described above in conjunction with FIG. 1.

A DTC calibration block (KDTC) 204 receives, from the loop filter 124, information 208 on the switching state of the "PVT" 136, "ACQ" 138, and "TRK" 140 banks, i.e., the first set of capacitors, for example in the form of current control codes 208 of the capacitor banks. Further, it receives frequency information 206, which, for example, may be identical with the frequency control word 108. Alternatively, the information 206 may comprise expected nominal control codes for the "PVT" 136, "ACQ" 138, and "TRK" 140 banks. The DTC calibration block 204 may then perform a calculation of the systematic relative capacitance error due to PVT variations, for example, according to equations 1, 2, and 3 above. The DTC block 118 comprises capacitors requiring calibration, the capacitors thus forming part of a second set of capacitors comprised in the DTC 204 oscillator control subsystem, separate from the first set of capacitors, i.e., the capacitors of the "PVT" 136, "ACQ" 138, and "TRK" 140 banks. In examples where the DTC capacitors are located on the same silicon die as those of the "PVT" 136, "ACQ" 138, and "TRK" 140 banks, i.e., the first set of capacitors, the DTC capacitors are subject to the same PVT variations as those of the first set of capacitors. The calibration of the gain for the DTC capacitors may then be performed using methods known per se, for example, a two-point DTC gain calibration technique on the residue error in quadratic form as disclosed in U.S. Pat. No. 9,608,641. The calculated systematic capacitance error can be used as a starting point for such a calibration.

Alternatively, or additionally, a MOD calibration block (KMOD) 202 receives information 208 on the switching state of the "PVT" 136, "ACQ" 138, and "TRK" 140 banks, i.e., the first set of capacitors, for example, in the form of current control codes 208 of the capacitor banks. Further, it receives frequency information 206, which, for example, may be identical with the frequency control word 108. Alternatively, the information 206 may comprise expected nominal control codes for the "PVT," "ACQ," and "TRK" banks. The KMOD block 202 may then perform a calculation of the systematic relative capacitance error due to PVT variations, for example, according to equations 1, 2, and 3 above. Calibration of the gain for the capacitors of the "MOD" bank 134 may then be performed, such as by using the calculated systematic relative capacitance error as a starting point. The capacitors of the "MOD" bank 134 form part of the second set of capacitors comprised in the MOD 134-KMOD 202 oscillator control subsystem. In examples where the "MOD" bank 134 capacitors are located on the same silicon die as those of the "PVT" 136, "ACQ" 138, and "TRK" 140 banks, i.e., the first set of capacitors, they are subject to the same PVT variations as those capacitors. Calibration of the gain for the MOD capacitors may then be performed using methods known per se, for example a two-point DCO gain calibration technique on the residue error in quadratic form as similar to the DTC calibration scheme disclosed in U.S. Pat. No. 9,608,641. The calculated systematic capacitance error can be used as a starting point for such a calibration.

Alternatively, or additionally, the calculated systematic capacitance error may be used for calibrating the gain for the capacitors of the "TRK" bank 140. In this case, those capacitors are part of the second set of capacitors, which thus may be a subset of the first set of capacitors.

Figure 5:
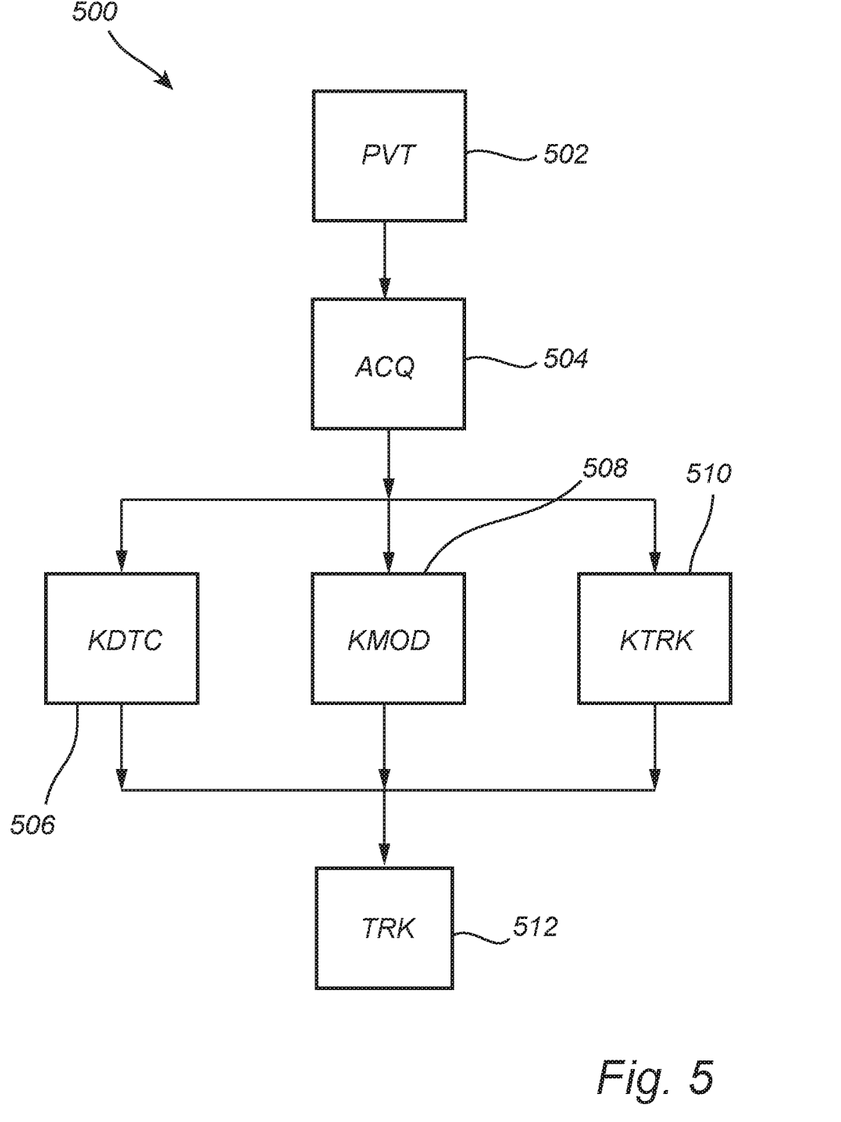
FIG. 5 is a flowchart of a procedure for controlling a signal generator and settling a phase-locked loop, in accordance with an example embodiment.

FIG. 5 shows an example procedure 500 for controlling the signal generator 100 and settling of the phase-locked loop 146.

In block 502, in a "PVT" step, acquisition of a frequency lock in the phase-locked loop 146 starts with a coarse frequency adjustment done using the "PVT" capacitor bank 136. This is performed in the phase-locked loop 146 using the counter 120 and controlled by the coarse frequency lock loop filter 126.

In block 504, in an "ACQ" step, acquisition of a frequency lock continues with a medium frequency adjustment done using the "ACQ" capacitor bank 138. This is performed in the phase-locked loop 146 using the counter 120 and controlled by the medium frequency lock loop filter 128, until a frequency lock has been acquired. The counter 120 may then be turned off to save power.

In blocks 506 and/or 508 and/or 510, calculation of the systematic capacitance error is performed, and, respectively, the DTC 188 capacitors are calibrated in a "KDTC" step, and/or the "MOD" capacitors 134 are calibrated in a "KMOD" step, and/or the "TRK" capacitors are calibrated in a "KTRK" step, in each case whereby the calculated systematic capacitance error is used, thereby compensating for process, voltage, and temperature variations common between the first set of capacitors and, respectively, the DTC 188 capacitors, the "MOD" capacitors 134 and the "TRK" 140 capacitors. This may be performed, as depicted in FIG. 5, after acquiring of the frequency lock in block 504, or, alternatively, may start already during acquisition of the frequency lock in block 504 and possibly block 502. The calculation of the systematic capacitance error may, for example, be performed as described above in conjunction with equations 1, 2, and 3 and/or FIG. 2.

In block 512, in a "TRK" step, acquisition of a phase lock is started using the "ACQ" capacitor bank 138. This is performed in the phase-locked loop 146 using the phase detection stage (TDC) 122 and controlled by the phase-lock loop filter 130 until a phase-lock has been acquired in the phase-locked loop 146.

Figure 4A:
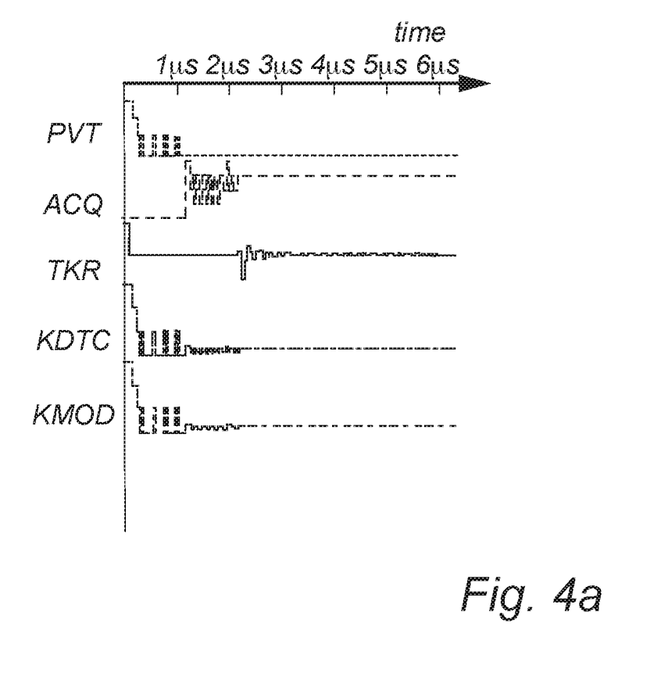
FIG. 4a is a timing diagram showing simulation results, in accordance with an example embodiment.
Figure 4B:
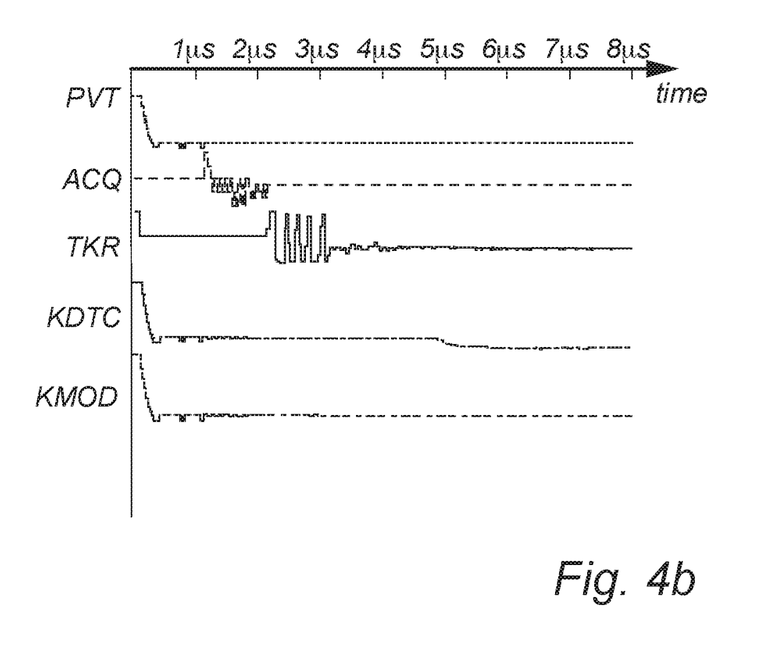
FIG. 4b is a timing diagram showing simulation results, in accordance with an example embodiment.
Figure 4C:
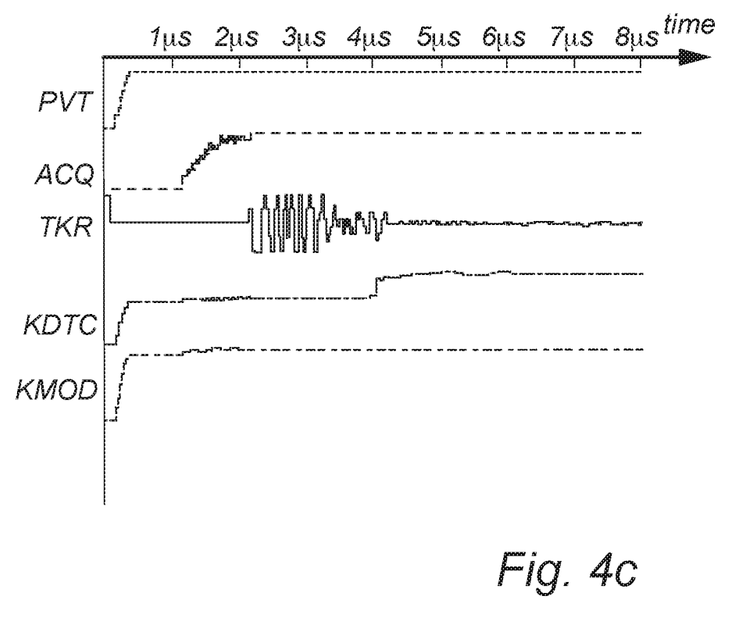
FIG. 4c is a timing diagram showing simulation results, in accordance with an example embodiment.

FIGS. 4a, 4b, and 4c show simulated performance of the signal generator during settling of the phase-locked loop 146. The systematic capacitance error is calculated and used in calibration of the DTC and MOD capacitors. Calibration starts already during acquisition of the frequency lock.

Shown are control codes for the "PVT," "ACQ," and "TRK" banks and calibrated capacitance gains for the DTC capacitors, labeled "KDTC," and the "MOD" capacitors, labeled "KMOD."

FIG. 4a shows a case of the oscillator capacitance, the oscillator inductance and the oscillator $G_m$ having their nominal values. Each of the "PVT," "ACQ," and "TRK" steps last about 1 μs, leading to a total settling time of about 3 μs.

FIG. 4b shows a case of the oscillator capacitance being 25% larger than its nominal value, the oscillator inductance being 2% larger than its nominal value, and the oscillator $G_m$ being 10% larger than its nominal value. The "PVT" and "ACQ" steps until frequency lock again each last about 1 μs, while the "TRK" phase until phase lock lasts about 2 μs. DTC fine tuning last another approximate 2 μs, leading to a total settling time of 6 μs.

Finally, FIG. 4c shows a case of the oscillator capacitance being 25% smaller than its nominal value, the oscillator inductance being 2% smaller than its nominal value, and the oscillator $G_m$ being 10% smaller than its nominal value. Again, the "PVT" and "ACQ" steps until frequency lock each last about 1 μs, the "TRK" phase until phase lock lasts about 2 μs, with DTC fine tuning last another approximate 2 μs, leading to a total settling time of 6 μs.

As a comparison, typical settling times, from any process corner, not using the techniques of the present disclosure, are: 5 μs for initial DCO calibration, 2 μs for the "PVT" step, 2 μs for the "ACQ" step, 15 μs for the "TRK" step, and 15 μs for DTC calibration, leading to a total settling time of 39 μs.

The present disclosure has mainly been described with reference to a limited number of examples. However, as is readily appreciated, other examples than the ones disclosed above are equally possible within the scope of the present disclosure, as defined by the appended claims.

What is claimed is:

1. A method of controlling a signal generator, wherein the signal generator comprises (i) a first set of capacitors at least partially switchably connectable for adjusting a frequency of an oscillator as part of a phase-locked loop, and (ii) a second set of capacitors comprised in one or more oscillator control subsystems, the method comprising:
   acquiring a frequency lock in the phase-locked loop;
   calculating, in conjunction with the acquiring of the frequency lock, a systematic capacitance error of the first set of capacitors due to process, voltage, and temperature variations, wherein calculating the systematic capacitance error comprises:
      calculating an actual capacitance of the first set of capacitors based on (i) the frequency of the oscillator and (ii) an inductance of an inductor of the oscillator,
      calculating a nominal capacitance of the first set of capacitors based on a switching state of the first set of capacitors, and
      calculating the systematic capacitance error based on the actual capacitance and the nominal capacitance; and
   calibrating the one or more oscillator control subsystems using the systematic capacitance error, thereby compensating for process, voltage, and temperature variations common between the first set of capacitors and the second set of capacitors.

2. The method of claim 1, wherein the one or more oscillator control subsystems comprises a modulation stage of the oscillator.

3. The method of claim 1, wherein the signal generator further comprises a phase-detection stage for the phase-locked loop, and wherein the phase-detection stage comprises a time-to-digital converter.

4. The method of claim 3, wherein the one or more oscillator control subsystems comprises a digital-to-time converter configured to produce a phase reference input to the phase-detection stage.

5. The method of claim 1, wherein the one or more oscillator control subsystems comprises a phase-lock loop filter controlling a capacitor bank, the capacitor bank being at least partially switchably connectable for adjusting the frequency of the oscillator as part of the phase-locked loop, and the capacitor bank being comprised in the second set of capacitors.

6. The method of claim 1, wherein the acquiring of the frequency lock occurs in a cycle-counting phase of the phase-locked loop.

7. The method of claim 1, wherein the calibrating of the one or more oscillator control subsystems occurs after the acquiring of the frequency lock.

8. The method of claim 1, wherein the calibrating of the one or more oscillator control subsystems occurs during the acquiring of the frequency lock.

9. The method of claim 1, further comprising acquiring a phase lock in a phase-detection phase of the phase-locked loop, wherein the calibrating of the one or more oscillator control subsystems occurs before or during the acquiring of the phase lock.

10. The method of claim 1, wherein the second set of capacitors are not part of the phase-locked loop.

11. The method of claim 1, wherein the oscillator is a digitally controlled oscillator.

12. The method of claim 1, wherein the phase-locked loop is an all-digital phase-locked loop.

13. A signal generator comprising:
   a first set of capacitors at least partially switchably connectable for adjusting a frequency of an oscillator as part of a phase-locked loop;
   a second set of capacitors comprised in one or more oscillator control subsystems; and
   a processor or circuitry configured to:
      calculate, in conjunction with acquiring of a frequency lock in the phase-locked loop, a systematic capacitance error of the first set of capacitors due to process, voltage, and temperature variations, wherein calculating the systematic capacitance error comprises:
         calculating an actual capacitance of the first set of capacitors based on the (i) frequency of the oscillator and (ii) an inductance of an inductor of the oscillator,
         calculating a nominal capacitance of the first set of capacitors based on a switch state of the first set of capacitors, and
         calculating the systematic capacitance error based on the actual capacitance and the nominal capacitance; and
      calibrate the one or more oscillator control subsystems using the systematic capacitance error, thereby compensating for process, voltage, and temperature variations common between the first set of capacitors and the second set of capacitors.

14. The signal generator of claim 13, wherein the one or more oscillator control subsystems comprises a modulation stage of the oscillator.

15. The signal generator of claim 13, further comprising a phase-detection stage for the phase-locked loop, wherein the phase-detection stage comprises a time-to-digital converter.

16. The signal generator of claim 15, wherein the one or more oscillator control subsystems comprises a digital-to-time converter configured to produce a phase reference input to the phase-detection stage.

17. The signal generator of claim 13, wherein the one or more oscillator control subsystems comprises a phase-lock loop filter controlling a capacitor bank, the capacitor bank being at least partially switchably connectable for adjusting the frequency of the oscillator as part of the phase-locked loop, and the capacitor bank being comprised in the second set of capacitors.

18. A wireless transceiver comprising the signal generator of claim 13.

19. The signal generator of claim 13, wherein the calibrating of the one or more oscillator control subsystems occurs after the acquiring of the frequency lock.

20. The signal generator of claim 13, wherein the calibrating of the one or more oscillator control subsystems occurs during the acquiring of the frequency lock.

* * * * *

UNITED STATES PATENT AND TRADEMARK OFFICE
CERTIFICATE OF CORRECTION

PATENT NO. : 10,862,489 B2
APPLICATION NO. : 16/670394
DATED : December 8, 2020
INVENTOR(S) : Johan van den Heuvel et al.

Page 1 of 1

It is certified that error appears in the above-identified patent and that said Letters Patent is hereby corrected as shown below:

On the Title Page

Item [74], delete "McDowell Boehnen Hulbert & Berghoff LLP" and insert -- McDonnell Boehnen Hulbert & Berghoff LLP --

Signed and Sealed this
Twelfth Day of January, 2021

Andrei Iancu
*Director of the United States Patent and Trademark Office*